United States Patent [19]
Yamada et al.

[11] Patent Number: 5,204,025
[45] Date of Patent: Apr. 20, 1993

[54] CONDUCTIVE PASTE COMPOSITION

[75] Inventors: Kimiko Yamada; Katuyosi Yada; Hiromu Inoue; Yousui Nemoto, all of Mie, Japan

[73] Assignee: Mitsubishi Petrochemical Co., Ltd., Tokyo, Japan

[21] Appl. No.: 681,899

[22] Filed: Apr. 8, 1991

[51] Int. Cl.$^5$ .................. H01B 1/22; C08L 63/00
[52] U.S. Cl. .................. 252/500; 252/512; 525/482; 525/483; 525/484; 523/137; 523/457; 523/458; 523/459
[58] Field of Search .............. 252/512, 500; 523/457–459, 137; 528/93, 99, 104, 113, 120, 148; 525/482, 483, 484

[56] References Cited

U.S. PATENT DOCUMENTS

| | | | |
|---|---|---|---|
| 2,951,825 | 9/1960 | Reinking et al. | 528/93 |
| 3,683,044 | 8/1972 | Huang et al. | 525/482 |
| 3,843,565 | 10/1974 | Yamamoto et al. | 525/484 |
| 4,201,854 | 5/1980 | Zondler et al. | 528/93 |
| 4,410,457 | 10/1983 | Fujimura et al. | 252/508 |
| 4,595,606 | 6/1986 | St. John et al. | 252/514 |
| 4,610,810 | 9/1986 | Hasegawa et al. | 252/512 |
| 4,652,398 | 3/1987 | Goswami et al. | 523/458 |
| 4,663,079 | 5/1987 | Yamaguchi et al. | 252/512 |
| 4,696,764 | 9/1987 | Yamazaki | 252/512 |
| 4,732,702 | 3/1988 | Yamazaki et al. | 252/512 |
| 4,937,015 | 6/1990 | Krieg et al. | 252/512 |
| 4,996,005 | 2/1991 | Saito et al. | 252/512 |
| 5,011,627 | 4/1991 | Lutz et al. | 252/512 |
| 5,045,236 | 9/1991 | Tsunaga et al. | 252/512 |

OTHER PUBLICATIONS

Database WPIL, No. 88-225 055, Derwent Publication Ltd., London (UK) & DW 8832 concerning to JP-A-6-3-161 015 (Sumitomo), Apr. 7, 1988.

Primary Examiner—Mark L. Bell
Assistant Examiner—C. M. Bonner
Attorney, Agent, or Firm—Oblon, Spivak, McClelland, Maier & Neustadt

[57] ABSTRACT

A conductive paste composition is described, which comprises an epoxy resin having a diglycidylamino group, a resol type phenol curing agent, and copper powder. The paste composition exhibits excellent moisture resistance and adhesion and provides a cured film of high conductivity level.

3 Claims, No Drawings

CONDUCTIVE PASTE COMPOSITION

FIELD OF THE INVENTION

This invention relates to an electrically conductive paste composition suitable for use as a shield from electromagnetic interference, etc.

BACKGROUND OF THE INVENTION

With the recent rapid spread of electronic equipment, electromagnetic interference (hereinafter abbreviated as EMI) has given rise to a problem. Counter measures against EMI include circuit means, such as use of antinoise parts, wire layout, use of a noise filter, grounding, and soft measures; and shield measures, such as cables, connectors, and cages.

The shield measures include a method of using metals, such as a metallic plate, a metallic foil, a metallic net, a metallic mesh, and a metal-plastic laminate; a method of surface treatment for imparting conductivity by zinc spray coating, conductive paste (paint) coating, gaseous phase plating, and electroless plating; and a method of using easy processing plastics having been rendered electrically conductive.

Besides as shields, conductive pastes (paints) are also useful as, for example, adhesives for circuit formation. Known conductive pastes for these uses include thermosetting resins having dispersed therein various conductive metal powders, e.g., copper/acrylic resin, nickel/acrylic resin, nickel/urethane resin, silver/acrylic resin, silver/epoxy resin, copper/phenol resin, and copper/epoxy resin.

Of these conductive pastes, copper/phenol resin type pastes and copper/epoxy resin type pastes have been mainly employed for particular use in shielding circuit bases. The former type pastes have high conductivity reaching a volume resistivity of $1 \times 10^{-4}$ $\Omega \cdot$cm but are insufficient in moisture resistance and adhesion to a resist. The latter type pastes exhibit satisfactory adhesion, etc. owing to the matrix epoxy resin but mostly have a conductivity in the order of $10^{-3}$ $\Omega \cdot$cm, though some of them have an initial conductivity of about $5 \times 10^{-4}$ $\Omega \cdot$cm, and thus fail to provide a cured film stably having a high level of conductivity.

SUMMARY OF THE INVENTION

Accordingly, an object of the present invention is to provide an epoxy resin-based conductive paste composition which is excellent in moisture resistance and adhesion to a resist and provides a conductive cured film of high conductivity level.

In the light of the above object, the inventors have conducted extensive investigations and, as a result, found that the object is accomplished by using an epoxy resin having a diglycidylamino group as a matrix resin of a conductive paste.

The present invention relates to a conductive paste composition comprising an epoxy resin having a diglycidylamino group, a resol type phenol curing agent, and copper powder.

DETAILED DESCRIPTION OF THE INVENTION

The epoxy resin which can be used in the present invention has at least one diglycidylamino group of formula:

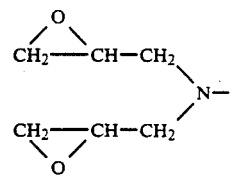

Specific examples of such an epoxy resin include glycidyl derivatives of aromatic amines, e.g., N,N,N',N,-tetraglycidyl-m-xylenediamine, diglycidylaniline, tetraglycidyldiaminodiphenylmethane, diglycidyltoluidine, and diglycidyltribromoaniline; glycidyl derivatives of alicyclic diamines, e.g., 1,3-(N,N-diglycidylaminomethyl)cyclohexane; and glycidyl derivatives of aminophenols, e.g., triglycidyl-p-aminophenol and triglycidyl-m-aminophenol.

The matrix resin of the paste composition preferably consists solely of the above-described diglycidylamino-containing epoxy resin. If desired, other epoxy resins may be used in combination in a minor proportion. In this case, other epoxy resins is usually used in a proportion of not more than 20% by weight, and preferably not more than 10% by weight, based on the total epoxy resins.

The resol type phenol which can be used as a curing agent is a phenol resin having a methylol group which is obtained by condensation of phenol and formaldehyde under an alkaline condition, i.e., in the presence of an alkali agent as a catalyst. Examples of suitable alkali agents are hydroxides of metals of the groups I and II of periodic table, e.g., sodium hydroxide, potassium hydroxide, calcium hydroxide, magnesium hydroxide, and barium hydroxide; ammonia, hexamethylenetetramine, sodium carbonate, and tertiary amines. Particularly preferred resol type phenols are those having an amino group which are obtained by using, as an alkali catalyst, ammonia, hexamethylenetetramine or a tertiary amine. Such amino-containing resol type phenol resins are commercially available from, e.g., Gun-ei Kagaku K.K. under trade names of Resitop series PS-4101, PS-4105, PS-4122, and PS-4139. The present invention can be carried out by using these products on the market. Since the commercial products are solid powders, they are used in the form of a solution in ethyl carbitol, etc.

The copper powder which can be used in the present invention is not particularly restricted in process of preparation. For example, any of powders obtained by electrolysis, spraying, grinding, and reduction can be employed. Copper powder obtained by electrolysis is recommended for providing a paste composition having excellent conductivity. Copper powder preferably has a particle size of not greater than 100 $\mu$m and, in particular, preferably comprises particles of 325 mesh or smaller in a proportion of at least 80% by weight from the standpoint of coating properties, printing properties and the like of the resulting paste composition. A mixture of two or more copper powders obtained by different processes may be used.

Copper powder generally undergoes gradual oxidation on its surface during storage to form a copper oxide surface layer. In this connection, usually available copper powders having a loss by reduction of 1.0% by weight or less (measured in accordance with JSPM Standard 363) may be used as they are. A loss by reduction, however, is preferably not more than 0.6% by weight, and more preferably not more than 0.2% by weight. Therefore, copper powder having undergone conspicuous oxidation during storage is preferably used after its surface oxide layer is removed by treating with an organic carboxylic acid so as to have the loss by reduction fall within the above-recited preferred range.

In a preferred embodiment of the conductive paste composition of the present invention, the resol type phenol curing agent is present at an equivalent ratio of from 0.5 to 1.5, particularly from 0.8 to 1.2, to the epoxy resin, and the copper powder is present in an amount of from 100 to 800% by weight, particularly from 300 to 600% by weight, based on the total amount of the epoxy resin and the resol type phenol curing agent.

If desired, the conductive paste composition of the present invention may further contain antioxidants, dispersing agents, diluting solvents, and so on.

Suitable antioxidants include phosphoric acid or derivatives thereof, phosphorous acid or derivatives thereof, anthracene derivatives, hydroxyphenol derivatives (e.g., hydroquinone and catechol), organic acids, rosin compounds, organotitanate compounds, and triazole derivatives.

Suitable dispersing agents include hydrogenated castor oil, metallic soaps, aluminum chelate compounds, organic bentonite, colloidal silica, oxidized polyethylene waxes, long-chain polyaminoamide, alkylamine polycarboxylates, etc. The dispersing agent is added, for example, for adjusting viscosity or imparting thixotropy in such an amount that does not impair conductivity of the resulting paste composition.

Suitable diluting solvents include ethyl cellosolve, butyl cellosolve, ethyl carbitol, butyl carbitol, ethyl cellosolve acetate, etc. The diluting solvent is used for viscosity adjustment to facilitate dispersion in a dispersing apparatus, printing by means of a screen printing machine, etc. A preferred viscosity of the paste composition is from 300 to 1000 poises in a paste state and from 50 to 200 poises for printing.

The paste composition of the present invention is prepared usually by means of a dispersing apparatus, e.g., a ball mill, a sand mill, a disper, a Hoover muller, a three-roll mill, a kneader, etc.

The conductive paste composition of the present invention is coated or printed by screen printing, transfer printing, or the like technique and then heated to form a cured film.

The present invention is now illustrated in greater detail with reference to the following Examples, but it should be understood that the present invention is not deemed to be limited thereto. All the parts and percents are by weight unless otherwise indicated.

EXAMPLE 1

Fifty parts of tetraglycidyldiaminodiphenylmethane ("Epikote 604" produced by Yuka Shell Epoxy K.K.), 108 parts of a 50% ethyl carbitol solution of a resol type phenol curing agent ("Resitop PS-4101" produced by Gun-ei Kagaku K.K.), and 500 parts of commercially available electrolytic copper powder for industrial use having an average particle size of 5 μm and a loss by reduction of 0.17% by weight were kneaded in a three-roll mill manufactured by Kodaira Seisakusho for 2 minutes to prepare a paste. The resulting paste was coated on a glass epoxy substrate by the use of a screen printing machine (made by Toyo Seimitsu Kogyo K.K.), and the coating film was heated at 150° C. for 5 hours to form a cured film having a thickness of 50 μm.

Performance properties of the cured film were evaluated according to the following test methods. The results obtained are shown in Table 1 below.

1) Volume Resistivity

Measured with a resistance meter ("LORESTA AP" manufactured by Mitsubishi Petrochemical Co., Ltd.). In Example 1, the volume resistivity of the sample was in the order of $10^{-5}$ Ω·cm as shown in Table 1.

2) Moisture Resistance

The sample after the resistivity measurement was allowed to stand at 66° C. and 90% RH for 1,000 hours and then its volume resistivity was again measured in the same manner as in 1) above.

3) Adhesion to Resist

Determined according to UL 746C.

EXAMPLE 2

A paste was prepared in the same manner as in Example 1, except for replacing Resitop PS-4101 with Resitop PS-4122 (produced by Gun-ei Kagaku K.K.) as a resol type phenol curing agent. A cured film was formed by using the resulting paste in the same manner as in Example 1. Performance properties of the cured film were evaluated in the same manner as in Example 1, and the results obtained are shown in Table 1.

COMPARATIVE EXAMPLE

A paste was prepared in the same manner as in Example 1, except for using 100 parts of a bisphenol F type epoxy resin ("Epikote 807" produced by Yuka Shell Epoxy K.K.), 4 parts of dicyandiamide (curing agent), and 400 parts of the same commercially available electrolytic copper powder as that in Example 1. A cured film was formed by using the resulting paste in the same manner as in Example 1. Performance properties of the cured film were evaluated in the same manner as in Example 1, and the results obtained are shown in Table 1.

EXAMPLE 3

A paste was prepared in the same manner as in Example 1, except for replacing Epikote 604 with 50 parts of tetraglycidyl-m-xylidenediamine ("TETRA D-X" produced by Mitsubishi Gas Chemical Industries, Ltd.). A cured film was formed by using the resulting paste in the same manner as in Example 1. Performance properties of the cured film were evaluated in the same manner as in Example 1, and the results obtained are shown in Table 1.

TABLE 1

| Example No. | Paste Composition (part) | | | Volume Resistivity (Ω · cm) | | Adhesion |
| | Copper Powder | Epoxy Resin | Curing Agent | Immediately After Curing | After Moisture Resistance Test | |
| --- | --- | --- | --- | --- | --- | --- |
| Example 1 | electrolytic copper (500) | Epikote 604 (50) | PS-4101 (54) | $3 \times 10^{-5}$ | $6 \times 10^{-5}$ | 5B |
| Example 2 | electrolytic copper (500) | Epikote 604 (50) | PS-4122 (54) | $6 \times 10^{-5}$ | $9 \times 10^{-5}$ | 5B |

TABLE 1-continued

| Example No. | Paste Composition (part) | | | Volume Resistivity ($\Omega \cdot cm$) | | Adhesion |
| --- | --- | --- | --- | --- | --- | --- |
| | Copper Powder | Epoxy Resin | Curing Agent | Immediately After Curing | After Moisture Resistance Test | |
| Example 3 | electrolytic copper (500) | TETRA D-X (50) | PS-4101 (54) | $3 \times 10^{-5}$ | $5 \times 10^{-5}$ | 5B |
| Comparative Example | electrolytic copper (400) | Epikote 806 (100) | dicyandiamide (4) | $1 \times 10^{-3}$ | $\infty$ | 5B |

As described and demonstrated above, the conductive paste composition according to the present invention exhibits excellent moisture resistance and adhesion owing to the epoxy matrix resin thereof and provides a cured film of high level of conductivity.

While the invention has been described in detail and with reference to specific examples thereof, it will be apparent to one skilled in the art that various changes and modifications can be made therein without departing from the spirit and scope thereof.

What is claimed is:

1. A conductive paste composition comprising an epoxy resin having a diglycidylamino group represented by the formula:

$$\begin{array}{c} CH_2 \overset{O}{-\!\!\!-\!\!\!-} CH - CH_2 \\ \phantom{CH_2 \overset{O}{-\!\!\!-\!\!\!-} CH}\diagdown \\ \phantom{CH_2 \overset{O}{-\!\!\!-\!\!\!-}}N\!\!-\!\!, \\ \phantom{CH_2 \overset{O}{-\!\!\!-\!\!\!-} CH}\diagup \\ CH_2 \overset{}{-\!\!\!-\!\!\!-} CH - CH_2 \\ \phantom{CH_2 -}\underset{O}{\diagdown\!\diagup} \end{array}$$

a resol phenol curing agent, and copper powder, with said epoxy resin being present in a proportion of at least 80% by weight based on the total epoxy resins, said resol phenol curing agent being a resol phenol containing an amino group which is obtained by condensation of phenol and formaldehyde in the presence of ammonia, hexamethylenetetramine or a tertiary amine and being present at an equivalent ratio of from 0.5 to 1.5 to the total epoxy resins and said copper powder being present in an amount of from 100 to 800% by weight of the total amount of the total epoxy resins and the resol phenol curing agent.

2. A conductive paste composition as claimed in claim 1, wherein said epoxy resin is selected from the group consisting of glycidyl derivatives of aromatic amines, glycidyl derivatives of alicyclic diamines, and glycidyl derivatives of aminophenols.

3. A conductive paste composition as claimed in claim 1, wherein said copper powder is electrolytic copper powder.

* * * * *

UNITED STATES PATENT AND TRADEMARK OFFICE
CERTIFICATE OF CORRECTION

PATENT NO. : 5,204,025

DATED : April 20, 1993

INVENTOR(S) : Kimiko Yamada et al.

It is certified that error appears in the above-identified patent and that said Letters Patent is hereby corrected as shown below:

On title page, item [30] insert Foreign Application Priority;

--May 2, 1990 [JP] Japan.............2-115133--

Signed and Sealed this

Seventh Day of December, 1993

*Attest:*

BRUCE LEHMAN

*Attesting Officer*     *Commissioner of Patents and Trademarks*